US010581429B2

(12) United States Patent
Weis et al.

(10) Patent No.: US 10,581,429 B2
(45) Date of Patent: Mar. 3, 2020

(54) ELECTRONIC CIRCUIT WITH SEVERAL ELECTRONIC SWITCHES CONNECTED IN SERIES AND A DRIVE CIRCUIT

(71) Applicant: Infineon Technologies Dresden GmbH & Co. KG, Dresden (DE)

(72) Inventors: Rolf Weis, Dresden (DE); Ralf Rudolf, Dresden (DE); Herwig Wappis, Drobollach (AT)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 15/995,809

(22) Filed: Jun. 1, 2018

(65) Prior Publication Data

US 2018/0351549 A1 Dec. 6, 2018

(30) Foreign Application Priority Data

Jun. 2, 2017 (DE) .................. 10 2017 112 248

(51) Int. Cl.
| H03K 17/00 | (2006.01) |
| H03K 17/687 | (2006.01) |
| H03K 17/10 | (2006.01) |
| H02M 1/088 | (2006.01) |
| H02M 3/158 | (2006.01) |

(52) U.S. Cl.
CPC ........ *H03K 17/6872* (2013.01); *H02M 1/088* (2013.01); *H02M 3/1588* (2013.01); *H03K 17/102* (2013.01); *H03K 2017/6875* (2013.01)

(58) Field of Classification Search
CPC ............ H03K 17/6872; H03K 17/102; H02M 3/1588; H02M 1/088

USPC .......................................................... 327/109
See application file for complete search history.

(56) References Cited

U.S. PATENT DOCUMENTS

| 9,337,732 B2* | 5/2016 | Kondou | ................ H02M 3/158 |
| 9,793,892 B2* | 10/2017 | Wu | .................... H03K 17/6872 |
| 9,859,274 B2* | 1/2018 | Weis | .................... H03K 17/102 |
| 2012/0175634 A1* | 7/2012 | Weis | ............... H01L 21/823418 |
| | | | 257/77 |
| 2012/0175635 A1* | 7/2012 | Weis | .................... H01L 27/0207 |
| | | | 257/77 |

(Continued)

FOREIGN PATENT DOCUMENTS

DE 102013213453 A1 1/2014

*Primary Examiner* — Ryan Jager
(74) *Attorney, Agent, or Firm* — Murphy, Bilak & Homiller, PLLC

(57) ABSTRACT

An electronic circuit includes: a drive circuit having an output coupled to a control node of a first electronic switch; a switch circuit with second electronic switches, load paths of the second electronic switches being connected in series, and the switch circuit being connected between a first load node of the first electronic switch and a reference node; and a level shifter coupled between a first signal input and an input of the drive circuit and including cascaded level shifter cells. Each level shifter cell includes a signal input and output, and first and second supply nodes. Each level shifter cell is associated with a respective second electronic switch. The first supply node of each level shifter cell is coupled to a first load node of the associated second electronic switch, and the second supply node is coupled to a second load node of the associated second electronic switch.

18 Claims, 10 Drawing Sheets

(56) References Cited

U.S. PATENT DOCUMENTS

| | | | | |
|---|---|---|---|---|
| 2014/0016361 A1* | 1/2014 | Weis | ...................... | H02M 7/217 |
| | | | | 363/21.02 |
| 2014/0016386 A1* | 1/2014 | Weis | ...................... | H02M 7/217 |
| | | | | 363/126 |
| 2015/0035586 A1* | 2/2015 | Weis | ..................... | H03K 17/687 |
| | | | | 327/436 |
| 2015/0123640 A1* | 5/2015 | Kondou | ............... | H03K 17/102 |
| | | | | 323/299 |

* cited by examiner

ELECTRONIC CIRCUIT WITH SEVERAL ELECTRONIC SWITCHES CONNECTED IN SERIES AND A DRIVE CIRCUIT

TECHNICAL FIELD

This disclosure in general relates to an electronic circuit, in particular an electronic circuit that includes several electronic switches connected in series.

BACKGROUND

Various types of electronic circuits include a series circuit with several electronic switches. An electronic switch is an electronic device that switches on and off dependent on a drive signal received at a control node, wherein the drive signal can be a current into the control node or a voltage between the control node and a load node of the electronic switch. In a MOSFET (Metal Oxide Semiconductor Field-Effect Transistor), for example, the control node is gate node and the drive signal is a voltage between the gate node and a source node, the latter being one of the load nodes of a MOSFET. In a MOSFET, the drive voltage is usually referred to as gate-source voltage.

An electronic circuit with an electronic switch may receive a drive signal for the switch from a control circuit, such as a microcontroller, or the like. This drive signals may be referenced to a certain electric potential such as ground. If the electronic switch, however, is not directly connected to this common electric potential the drive signal received by electronic circuit cannot directly be used to drive the electronic switch. In this case, a level shifter may be used to generate, from the drive signal received by the electronic circuit, a drive signal suitable to drive the electronic switch.

SUMMARY

One example relates to an electronic circuit. The electronic circuit includes a first electronic switch, a drive circuit, a switch circuit, a first signal input, and a level shifter. The drive circuit include an output coupled to a control node of the first electronic switch and an input. The switch circuit includes a plurality of second electronic switches, wherein load paths of the second electronic switches are connected in series, and wherein the switch circuit is connected between a first load node of the first electronic switch and a reference node. The first signal input is configured to receive a first input signal. The level shifter is coupled between the first signal input and the input of the drive circuit and includes a plurality of cascaded level shifter cells. Each of the plurality of level shifter cells includes a signal input, a signal output, a first supply node and a second supply node and is associated with a respective one of the plurality of second electronic switches. Further, the first supply node of each of the plurality of level shifter cells is coupled to a first load node of the associated second electronic switch and the second supply node of each level shifter cell is coupled to a second load node of the associated second electronic switch.

Another example relates to a method. The method includes driving a first electronic switch by a drive circuit based on an input signal received by the drive circuit, and generating the input signal received by drive circuit by a level shifter circuit based on an input signal received by the level shifter circuit. The level shifter circuit comprises a plurality of cascaded level shifter cells. Each of the plurality of level shifter cells is associated with a respective one of a plurality of second electronic switches and has a first supply node coupled to a first load node of the associated second electronic, and load paths of the plurality of second electronic switches are connected in series between a first load node of the first electronic switch and a reference node.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
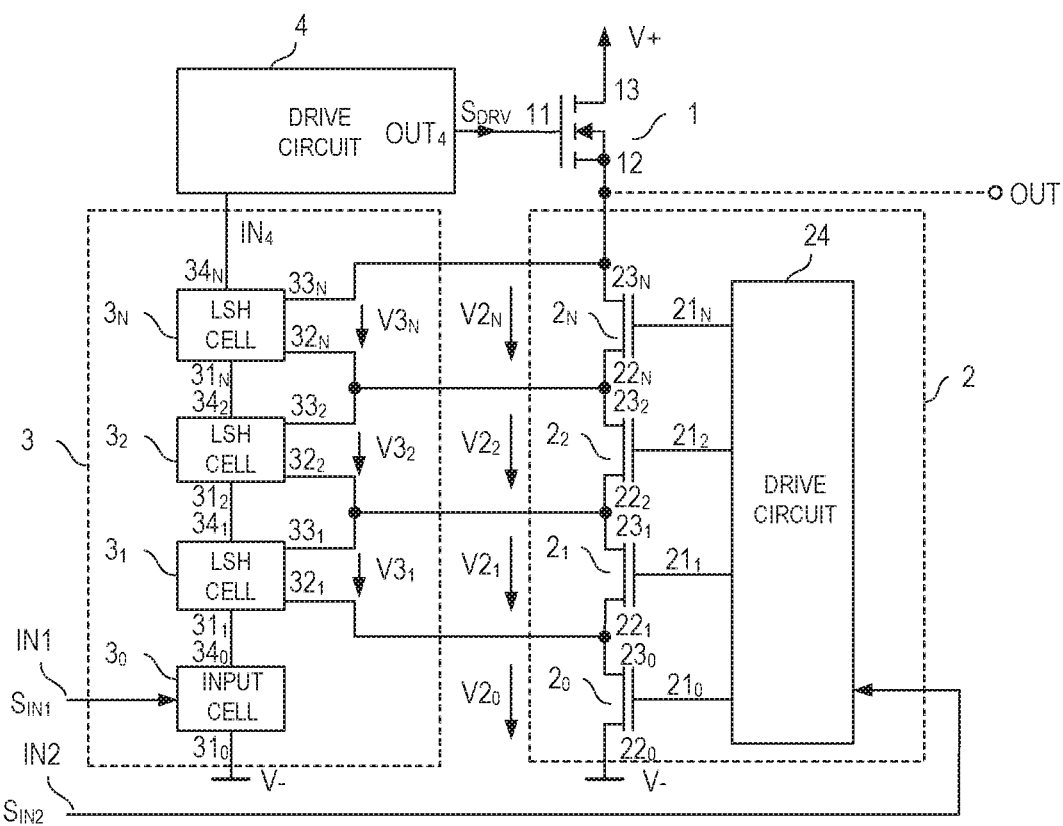
FIG. 1 shows one example of an electronic circuit with a first electronic switch, a switch circuit with several second electronic switches, and a level shifter with several level shifter cells.

FIG. 1 shows an electronic circuit according to one example. The electronic circuit includes a first electronic switch 1, a switch circuit 2 with a plurality of second electronic switches $2_0$, $2_1$, $2_2$, $2_N$, a drive circuit 4 configured to drive the first electronic switch 1, and a level shifter 3 coupled between a first input IN1 of the electronic circuit and an input $IN_4$ of the drive circuit 4. The second electronic switches $2_0$-$2_N$ each include a control node $21_0$-$21_N$ and a load path between a respective first load node $22_0$-$22_N$ and a respective second load node $23_0$-$23_N$. The load paths of these second electronic switches $2_0$-$2_N$ are connected in series between a first load node 12 of the first electronic switch 1 and a circuit node configured to receive a first supply potential V−. The first supply potential V− may be ground. The circuit node configured to receive the first supply potential V− is referred to as reference node or ground node in the following.

The electronic circuit is configured to receive a first input signal $S_{IN1}$ at the first input IN1. This first input signal $S_{IN1}$ may be generated by a control circuit (not shown) of any kind. According to one example, the control circuit is a microcontroller or includes a microcontroller. According to one example, the first input signal $S_{IN1}$ is an input voltage that is referenced to the reference node. The input signal $S_{IN1}$ indicates a desired switching state of the first electronic switch 1. That is, the first input signal $S_{IN1}$ indicates whether the first electronic switch 1 is to be switched on or off. The first electronic switch 1 switches on or off dependent on a first drive signal $S_{DRV1}$ received from the drive circuit 4 at a control node 11 of the first electronic switch 1. According to one example, the drive signal $S_{DRV}$ is a drive voltage that is referenced to the first load node 12. That is, the first electronic switch 1 switches on or off dependent on a voltage level of a drive voltage between the control node 11 and the first load node 12. Referring to FIG. 1, the first electronic switch 1 may be implemented as a MOSFET (Metal Oxide Semiconductor Field-Effect Transistor). In this case, the control node 11 is a gate node of the MOSFET, the first load node 12 is a source node of the MOSFET, and a second load node 13 is a drain node of the MOSFET. In case of a MOSFET, the drive voltage is usually referred to as gate-source voltage. However, implementing the first electronic switch 1 as a MOSFET is only an example. Any other type of electronic switch, in particular, any other type of voltage-controlled electronic switch may be used as well. Other examples of a voltage-controlled electronic switch include, but are not restricted to, an IGBT (Insulated Gate Bipolar Transistor), a JFET (Junction Field-Effect Transistor), a HEMT (High Electron Mobility Transistor) such as a GaN-HEMT, or carbon nanotubes. These devices may be comprised of or include at least one of the following materials: silicon (Si), silicon oxide (SiO), silicon nitride (SiN), aluminum oxide ($Al_2O_3$), silicon carbide (SiC), gallium nitride (GaN), gallium arsenide (GaAs,) carbon, such as a carbon monolayer.

According to one example, the switch circuit 2 can be operated in an on-state or an off-state. In the on-state, each of the second electronic switches $2_0$-$2_N$ is in an on-state so that the first load node 12 of the first electronic switch 1 is electrically connected to the reference node. In the off-state, at least one of the second electronic switches $2_0$-$2_N$ is in an off-state so that the first load node 12 of the first electronic switch 1 is disconnected (electrically insulated) from the reference node. In the on-state of the switch circuit 2, an electrical potential at the first load node 12 of the first electronic switch 1 essentially equals the first supply potential V−, while in the off state of the switch circuit 2 the potential at the first load node 12 may be different from the first supply potential V−. A series circuit with the first electronic switch 1 and the switch circuit 2 may be connected between the first supply node and a second supply node, wherein the second supply node is configured to receive a second supply potential V+. If, for example, the switch circuit 2 is in the off-state and the first electronic switch 1 is in the on-state, the electrical potential at the first load node 12 of the first electronic switch 1 essentially equals the second supply potential V+. Thus, the potential at the first load node 12 of the first electronic switch 1 may vary dependent on an operation state of the switch circuit 2. Due to this, the first input signal $S_{IN1}$, which is referenced to the reference node, cannot directly be used as the drive signal for driving the first electronic switch 1.

In the electronic circuit shown in FIG. 1, the drive circuit 4 generates the drive signal $S_{DRV}$ received by the first electronic switch 1 as a voltage referenced to the first load node 12. The drive circuit 4 generates the drive signal $S_{DRV}$ based on the first input signal $S_{IN1}$, wherein the information on the desired switching state of the first electronic switch 1 included in the first input signal $S_{IN1}$ is transmitted from the first input IN1 to the input $IN_4$ of the drive circuit 4 by the level shifter 3.

Figure 2:
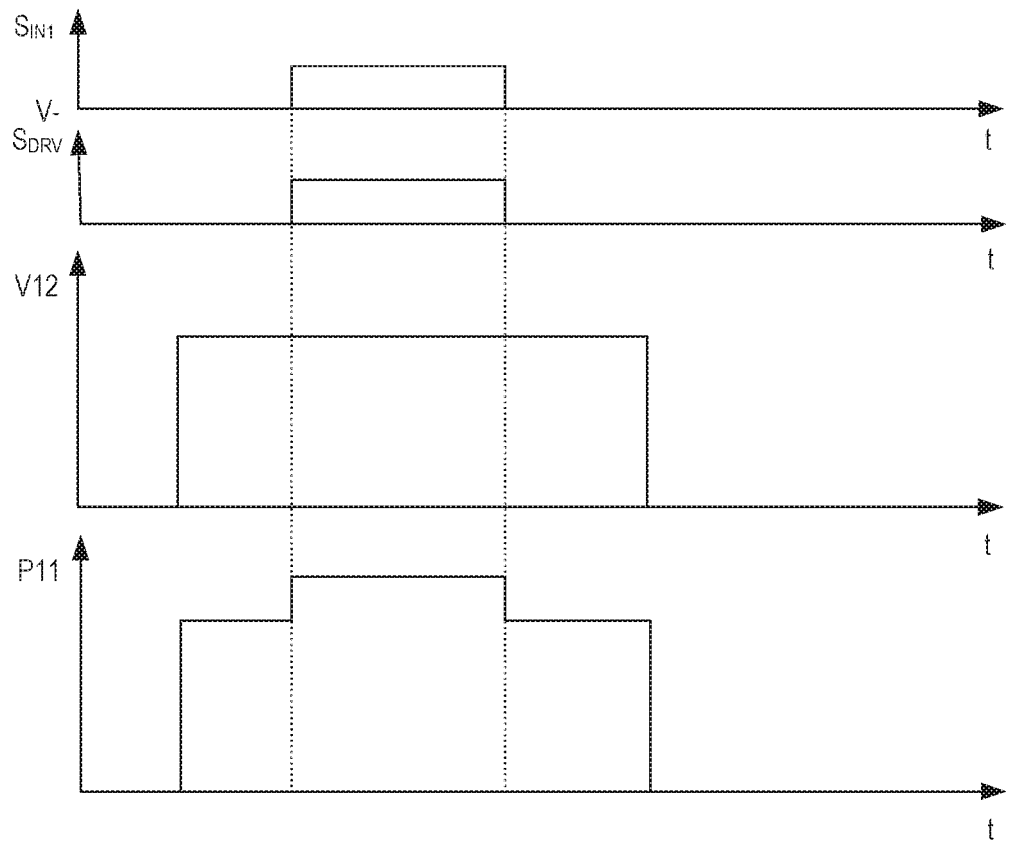
FIG. 2 shows timing diagrams of an input signal received by and a drive signal generated by the electronic circuit shown in FIG. 1 during operation.

FIG. 2 illustrates one example of how the electronic circuit may be operated. FIG. 2 shows examples of timing diagrams of the first input signal $S_{IN1}$, a potential V12 at the first load node 12 of the first electronic switch 1, and the drive signal $S_{DRV}$. Referring to the above, the first input signal $S_{IN1}$ is a voltage that is referenced to the reference potential V−. According to one example, the first input signal $S_{IN1}$ either has an on-level or an off-level. The on-level indicates that it is desired to switch on the first electronic switch 1, and the off-level indicates that it is desired to switch off the first electronic switch 1. Just for the purpose of illustration, the on-level is drawn as a high signal level and the off-level is drawn as a low signal level in the example shown in FIG. 2. Referring to FIG. 2, the drive signal $S_{DRV}$ is a voltage referenced to the first load node 12 of the first electronic switch 1. In FIG. 2, V12 denotes the electrical potential (voltage) at the first load node 12 relative to the reference node. As explained above, this voltage V12 may vary. Dependent on the first input signal $S_{IN1}$, the drive signal $S_{DRV}$ has an on-level or an off-level, wherein the on-level switches on the first electronic switch 1 and the off-level switches off the first electronic switch 1. Just for the purpose of illustration, the on-level is drawn as a high signal level and the off-level is drawn as a low signal level in the example shown in FIG. 2. In the example shown in FIG. 2, the potential V12 changes while the input signal $S_{IN1}$ and, consequently, the drive signal $S_{DRV}$ have an off-level. This change of the electric potential V12 does not change the signal level of drive signal $S_{DRV}$ relative to the potential V12 at the first load, but changes a potential P11 at the control node 11 relative to the reference node. This potential is also shown in FIG. 2.

There may be time delays between instances when the input signal $S_{IN1}$ changes its signal level and corresponding time instances when the drive signal $S_{DRV}$ changes its signal level. However, these time delays, which may result from propagation delays in the level shifter 3, are not shown in FIG. 2.

Referring to FIG. 1, the level shifter 3 includes a plurality of cascaded level shifter cells $3_1$, $3_2$, $3_N$. Each of these level shifter cells $3_1$-$3_N$ includes a signal input $31_1$-$31_N$, a signal output $34_1$-$34_N$, a first supply node $32_1$-$32_N$ and a second supply node $33_1$-$33_N$. The plurality of level shifter cells $3_1$-$3_N$ includes a lowermost level shifter cell $3_1$ and an uppermost level shifter cell $3_N$. The signal output $34_N$ of the uppermost level shifter cell $3_N$ is coupled to the input $IN_4$ of the drive circuit 4, and the signal input $31_1$ of the lowermost level shifter cell $3_1$ is coupled to a signal output $34_0$ of an input cell of the level shifter 3. Each of the other level shifter cells (wherein there is only one such other level shifter cell shown in FIG. 1 besides the uppermost and the lowermost level shifter cells $3_N$, $3_1$) has its signal input connected to the signal output of a neighboring level shifter cell and has its signal output connected to the signal input of another neighboring level shifter cell. For example, as shown in FIG. 1, the signal input $31_2$ of the level shifter cell $3_2$ is connected to the signal output $34_1$ of neighboring level shifter cell $3_1$, and the signal output $34_2$ of level shifter cell $3_2$ is connected to the signal input $31_N$ of the other neighboring level shifter $3_N$. The input cell $3_0$ includes a signal input $31_0$ coupled to the first input IN1 of the electronic circuit, so that the input cell $3_0$ receives the first input signal $S_{IN1}$.

In the example shown in FIG. 1, the level shifter includes N level shifter cells $3_1$-$3_N$ and one input cell $3_0$, wherein N=3. However, N=3 is only an example. The level shifter may be implemented with any number of level shifter cells. Referring to the explanation below, the number of level shifter cells may be dependent on the specific implementation of the switch circuit 2.

Referring to FIG. 1, each of the level shifter cells $3_1$-$3_N$ is associated with a respective one the plurality of second electronic switches. According to one example shown in FIG. 1, each level shifter cell $3_1$-$3_N$ is associated with a respective second electronic switch $2_1$-$2_N$, but not each of the second electronic switches $2_0$-$2_N$ is associated with a level shifter cell $3_1$-$3_N$. In the example shown in FIG. 1, a second electronic switch $2_0$ that has its first load node $22_0$ directly connected to the reference node does not have an associated level shifter cell. Each of the other second electronic switches, that is, electronic switches $2_1$-$2_N$ shown in FIG. 1, is associated with a respective one of the level shifter cells $3_1$-$3_N$.

Referring to FIG. 1, the first supply node $32_1$-$32_N$ of each of the plurality of level shifter cells $3_1$-$3_N$ is coupled to the first load node $22_1$-$22_N$ of the associated second electronic switch $2_1$-$2_N$, and the second supply node $33_1$-$33_N$ is coupled to the second load node $23_1$-$23_N$ of the associated second electronic switch $2_1$-$2_N$, so that a voltage $V2_1$-$V2_N$ received between the second supply node $33_N$-$33_1$ and the first supply node $32_N$-$32_1$ of each level shifter cell $31_1$-$31_N$ is dependent on a load path voltage of the associated second electronic switch $2_1$-$2_N$. The "load path voltage" is the voltage between the second load node $23_1$-$23_N$ and the first load node $22_1$-$22_N$ of the respective second electronic switch $2_1$-$2_N$. This load path voltage $V2_1$-$V2_N$, inter alia, is dependent on a switching state of the respective electronic switch $2_1$-$2_N$. That is, the load path voltage $V2_1$-$V2_N$ is dependent on whether the respective second electronic switch $2_1$-$2_N$ is in the on-state or the off-state. In the example shown in FIG. 1, a voltage $V3_1$-$V3_N$ received between the second supply node $33_1$-$33_N$ and the first supply node $32_1$-$32_N$ of each level shifter cell $3_1$-$3_N$ equals the load path voltage $V2_1$-$V2_N$ of the associated second electronic switch $2_1$-$2_N$. This, however, is only an example.

Figure 3:
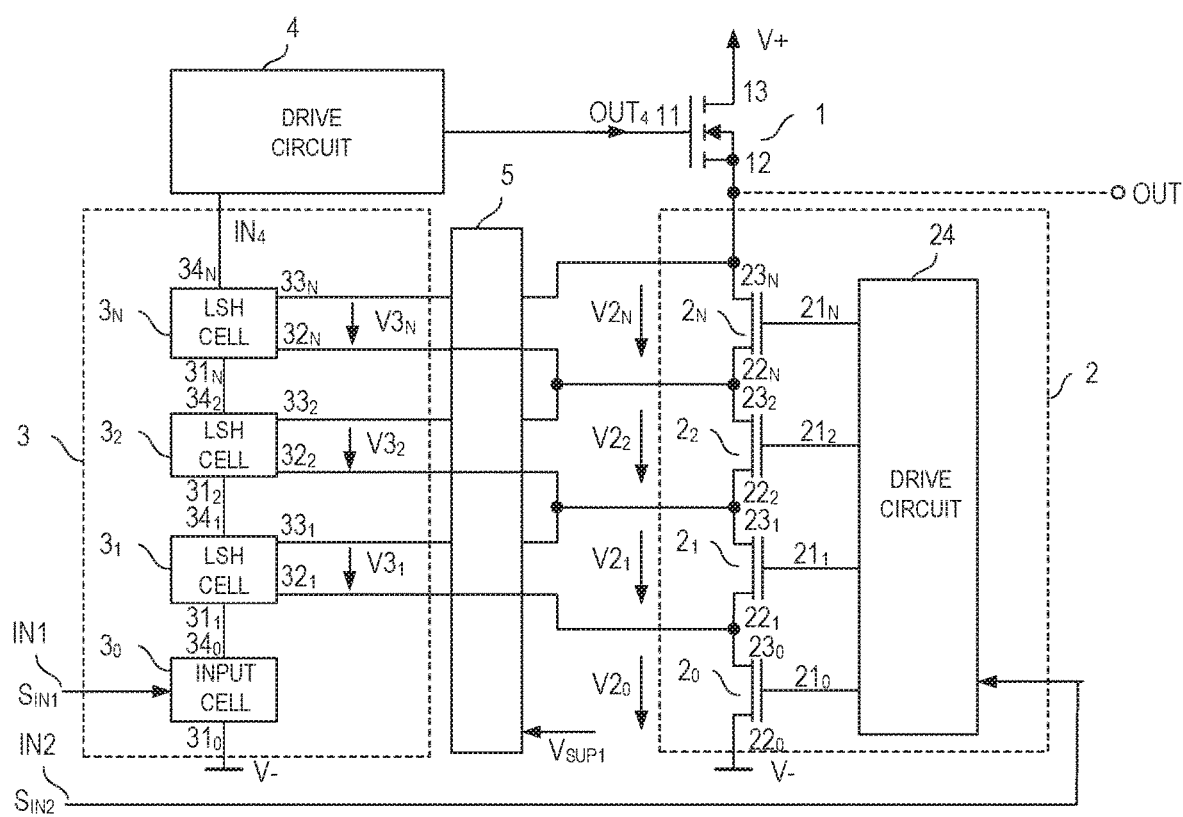
FIG. 3 shows another example of an electronic circuit with a first electronic switch, a switch circuit with several second electronic switches, and a level shifter with several level shifter cells.

According to another example, shown in FIG. 3, a voltage select circuit 5 is coupled between the load nodes of the second electronic switches $2_1$-$2_N$ and the supply nodes of the level shifter cells $3_1$-$3_N$. This voltage select circuit 5 receives a supply voltage $V_{SUP1}$ and is configured to generate the supply voltages $V3_1$-$V3_N$ received by the level shifter cells $3_1$-$3_N$ such that these voltages either substantially equal the load path voltage $V2_1$-$V2_N$ of the associated second electronic switch $2_1$-$2_N$ or the supply voltage $V_{SUP1}$, whichever is higher.

Figure 4:
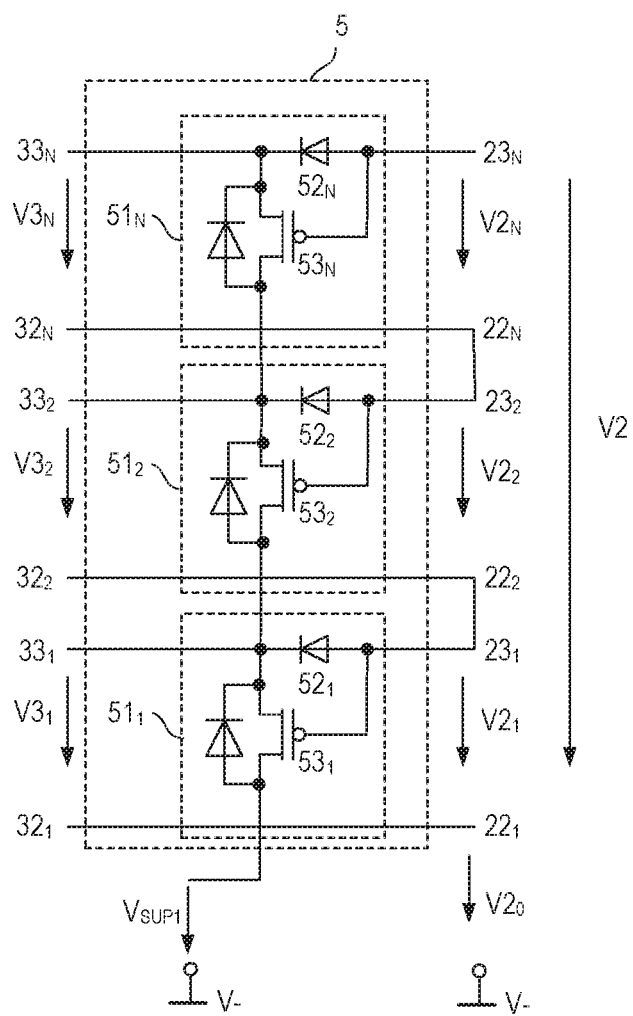
FIG. 4 shows one example of a voltage select circuit of the electronic circuit shown in FIG. 3.

One example of the voltage select circuit 5 is shown in FIG. 4. Referring to FIG. 4, the voltage select circuit 5 includes a plurality of select cells $51_1$, $51_2$, $51_N$, wherein each of these select cells $51_1$-$51_N$ is connected between the second supply node $33_1$-$33_N$ of a respective level shifter cell (not shown in FIG. 3) and the second load node $23_1$-$23_N$ of the associated second electronic switch (not shown in FIG. 3). Each select cell $51_1$-$51_N$ includes a rectifier element $52_1$-$52_N$, such as a bipolar diode, that is connected between the second load node $23_1$-$23_N$ and the second supply node $33_1$-$33_N$. Further, each select cell includes a transistor element $53_1$-$53_N$ that has its control node connected to the second load node $23_1$-$23_N$ of the associated second electronic switch. Load paths of the transistor elements $53_1$-$53_N$ of the select cells $51_1$-$51_N$ are connected in series. Further, the rectifier element $52_1$-$52_N$ of each select cell $51_1$-$51_N$ is connected between the control node and a first load node of the transistor element $53_1$-$53_N$ of the respective select cell $5_1$-$5_N$. According to one example, the transistor elements $53_1$-$53_N$ are p-type transistors, such as p-type MOSFETs. Such p-type MOSFETs may include internal diodes (which are often referred to as body diodes), which are also shown in FIG. 4. The select cells $51_1$-$51_N$ include a lowermost select cell $51_1$, which is the select cell connected to the lowermost level shifter cell $3_1$ (from which only the supply nodes $32_1$, $33_1$ are shown in FIG. 4). The transistor element $53_1$ of the lowermost select cell $51_1$ receives the supply potential $V_{SUP1}$ at a second load node. The supply potential $V_{SUP1}$ is referenced to the reference node.

Referring to FIG. 4, each of the select cells $51_1$-$51_N$ provides a supply voltage $V3_1$-$V3_N$ to the associated level shifter cell. This supply voltage $V3_1$-$V3_N$ is generated by the individual select cells $51_1$-$51_N$ from the supply voltage $V_{SUP1}$ and the load path voltage $V2_1$-$V2_N$ of the associated second electronic switch $2_1$-$2_N$, wherein the load path voltage $V2_1$-$V2_N$ is the voltage between the first load node $21_1$-$21_N$ and the second load node $23_1$-$23_N$ of the second electronic switches $2_1$-$2_N$.

Let $51_i$ be an arbitrary one of the select cells $51_1$-$51_N$, let $V3_i$ be the supply voltage provides by select cell $51_i$ between circuit nodes $33_i$, $32_i$, and let $V2_i$ be the load path voltage received by the select cell $51_i$ at circuit nodes $23_i$, $22_i$, and let $52_i$ be the diode and $53_i$ be the MOSFET of the select cell $51_i$. The select cell $51_i$ essentially passes through to circuit node $33_i$ the electrical potential received at circuit node $23_i$ or the electrical potential at circuit node $33_{i-1}$, whichever is higher.

This may result in that the supply voltages $V3_1$-$V3_N$ received by the individual level shifter cells $3_1$-$3_N$ (not shown in FIG. 4) each essentially equal the supply voltage $V_{SUP1}$ if an overall load path voltage V2, which is the sum of the individual load path voltages $V2_0$-$V2_N$ is lower than the supply voltage $V_{SUP1}$. This, for example, may occur when the switch circuit 2 is in the on-state. In this case, each of the transistor elements $53_1$-$53_N$ of the individual select cells $51_1$-$51_N$ switches on so that the supply voltages $V3_1$-$V3_N$ received by the individual level shifter cells each essentially equal the supply voltage $V_{SUP1}$ (if the electronic circuit is in a steady state). In this operation scenario, the rectifier elements $52_1$-$52_N$ block the voltage difference between the supply voltage $V_{SUP1}$ and the individual load path voltages $V2_1$-$V2_N$.

In the example shown in FIGS. 1 and 3, the electronic circuit includes a second input IN2 configured to receive a second input signal $S_{IN1}$. The second input signal $S_{IN2}$ is received by the switch circuit 2 and indicates whether it is desired to switch on or switch off the switch circuit 2. In these examples, the first electronic switch 1 and the switch circuit 2 can be switched on and off independent from one another. In this example, the first electronic switch 1 and the switch circuit 2 may form a half bridge with an output OUT connected to a circuit node common to the electronic switch 1 and the switch circuit 2. This output OUT is configured to have a load (not shown in FIGS. 1 and 3) connected thereto. The load may be connected between the output OUT and the reference node (first supply node) or between the output OUT and the second supply node, for example. In this type of configuration, the first electronic switch 1 and the switch circuit 2 may be driven by the first and second input signals $S_{IN1}$, $S_{IN2}$ such that only one of the electronic switch 1 and the switch circuit 2 is switched on at the same time in order to prevent a cross current between the first and second supply nodes.

Referring to FIGS. 1 and 3, the switch circuit 2 may include a drive circuit 24 that receives the second input signal $S_{IN2}$ and drives the second electronic switches $2_0$-$2_N$ based on the second input signal $S_{IN2}$. According to one example, the second electronic switches $2_0$-$2_N$ are transistor devices such as MOSFETs, JFETs, HEMTs etc. These transistor devices are only schematically illustrated in FIGS. 1 and 3.

Figure 5:
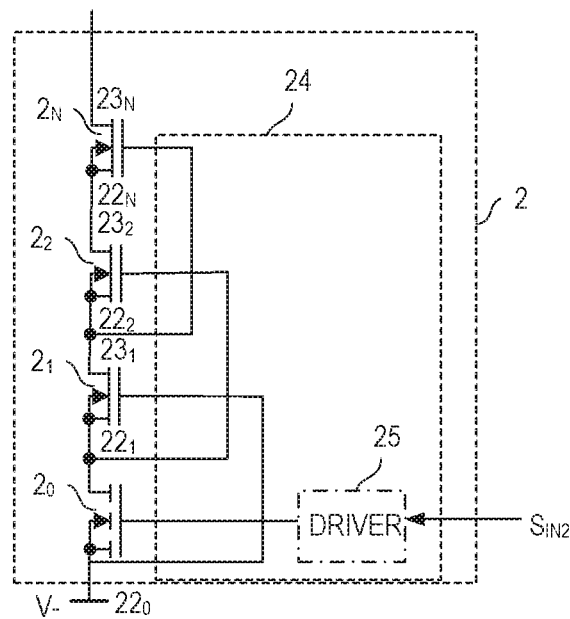
FIG. 5 shows one example of the switch circuit.

According to one example shown in FIG. 5, a lowermost electronic switch $2_0$, which is the second electronic switch that has its first load node $22_0$ directly connected to the first supply node, is an enhancement MOSFET (normally-off MOSFET) and the other second electronic switches $2_1$-$2_N$ are depletion MOSFETs (normally-on MOSFETs) or JFETs. Referring to FIG. 5, the drive circuit 24 optionally includes a driver 25 that receives the second input signal $S_{IN2}$ and is configured to switch on or off the lowermost second electronic switch $2_0$ based on the second input signal $S_{IN2}$. Implementing the lowermost second electronic switch $2_0$ as a normally-off MOSFET is only an example. According to another example, the lowermost second electronic switch $2_0$ is implemented as a normally-on MOSFET.

In the example shown in FIG. 5, the switching state of the lowermost second electronic switch $2_0$ also controls the switching state of the other second electronic switches $2_1$-$2_N$. That is, the other second electronic switches $2_1$-$2_N$ automatically switch on when the lowermost second electronic switch $2_0$ based on the second input signal $S_{IN2}$ switches on and the other second electronic switches $2_1$-$2_N$ automatically switch off when the lowermost second electronic switch $2_0$ switches off. This is obtained by suitably wiring the other second electronic switches $2_1$-$2_N$. In this example, the other second electronic switches $2_1$-$2_N$ are wired such that each of the other second electronic switches $2_1$-$2_N$ receives as a drive voltage between its control node $21_1$-$21_N$ and its first load node $22_1$-$22_N$ the load path voltage $V2_0$-$V2_N$ of the lowermost second electronic switch $2_0$ or of another one of the second electronic switches. More specifically, in the example shown in FIG. 5, second electronic switch $2_1$ receives as a drive voltage the load path voltage $V2_0$ of the lowermost second electronic switch $2_0$, second electronic switch $2_2$ receives as a drive voltage the load path voltage of neighboring second electronic switch $2_1$, and so on. This, however, is only example. The second electronic switches $2_0$-$2_N$ could also be wired such that one or more of these electronic switches receives as a drive voltage a sum of the load path voltages of two or more neighboring second electronic switches.

Figure 6:
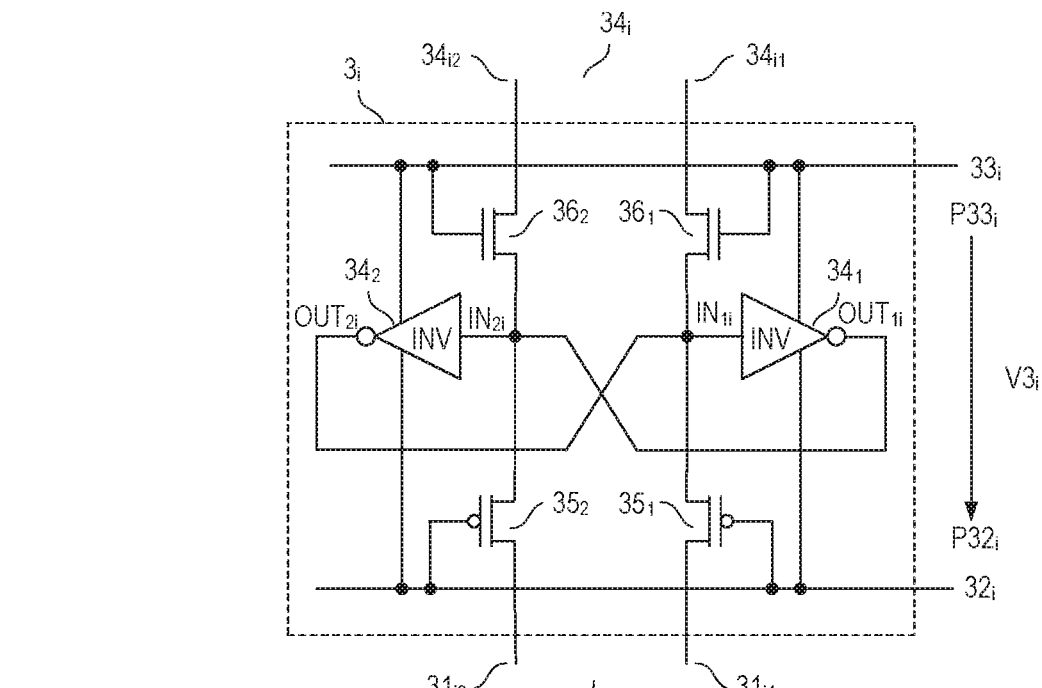
FIG. 6 shows one example of a level shifter cell.

FIG. 6 shows one example of a level shifter cell $31_i$. The level shifter cell $31_i$ shown in FIG. 6 represents any of the level shifter cells $3_1$-$3_N$ explained before. In FIG. 6, $31_i$ denotes the signal input, $34_i$ denotes the signal output, $32_i$ denotes the first supply input, and $33_i$ denotes the second supply input of the level shifter cell $3_i$. $V3_i$ denotes the supply voltage received by the level shifter cell $3_i$ between the first and second supply input $32_i$, $33_i$. An electrical potential of the second supply input $33_i$ is referred to as $P33_i$ and an electric potential of the first supply input $32_i$ is referred to as $P32_i$ in the following. The supply voltage is the difference between these potentials, that is, $$V3_i = P33_i - P32_i.$$

In the level shifter cell $3_i$ shown in FIG. 6, the signal input $31_i$ is a differential input, and the signal output $34_i$ is a differential output. Consequently, the signal input $31_i$ includes a first input node $31_{i1}$ and a second input node $31_{i2}$ and the signal output $34_i$ includes a first output node $34_{i1}$ and a second output node $34_{i2}$.

The level shifter stage $3_i$ further includes a first inverter $34_1$ with an input $IN_{1i}$ and an output $OUT_{1i}$ and a second inverter $34_2$ with an input $IN_{2i}$ and an output $OUT_{2i}$. Each of these inverters $34_1$, $34_2$ receives the supply voltage $V3_i$ at supply nodes. That is, the supply nodes of the inverters $34_1$, $34_2$ are connected between the second supply input $33_i$ and the first supply $32_i$. The first and second inverters $34_1$, $34_2$ are cross-coupled. That is, the output $OUT_{1i}$ of the first inverter $34_1$ is connected to the input $IN_{2i}$ of the second inverter $34_2$, and the output $OUT_{2i}$ of the second inverter $34_2$ is connected the input $IN_{1i}$ of the first inverter $34_1$. The input $IN_{1i}$ of the first inverter $34_1$ (and, therefore, the output $OUT_{2i}$ of the second inverter $34_2$) is connected to the first input node $31_{i1}$ via a load path of a first input transistor $35_1$ and the second output node $34_{i1}$ via a load path of a first output transistor $36_1$. The input node $IN_{2i}$ of the second inverter $34_2$ (and, therefore, the output $OUT_{1i}$ of the first inverter $34_1$) is connected to the second input node $31_{i2}$ via a load path of a second input transistor $35_2$ and the second output node $34_{i2}$ via a load path of a second output transistor $36_2$. A control node of each of the first and second input transistors $35_1$, $35_2$ is connected to the first supply input $32_i$, and a control node of the each of the first and second output transistors $36_1$, $36_2$ is connected to the second supply input $33_i$. The input transistors $35_1$, $35_2$ and the output transistors $36_1$, $36_2$ are transistors of complementary transistor types. In the example shown in FIG. 6, the input transistors $35_1$, $35_2$ are p-type transistors and the output transistors $36_1$, $36_2$ are n-type transistors. Just for the purpose of illustration, these input transistors and output transistors are drawn as MOSFETs. According to one example, these MOSFETs are enhancement MOSFETs.

An electric potential at the output $OUT_{1i}$, $OUT_{2i}$ of the inverters $34_1$, $34_2$ is either the second supply potential $P33_i$ or the first supply potential $P32_i$. By virtue of cross-coupling the first and second inverters $34_1$, $34_2$ the potential at the output of one of the first and second inverters $34_1$, $34_2$ essentially equals the second supply potential $P33_i$, and the potential at the output of the other one of the first and second inverters $34_1$, $34_2$ essentially equals the first supply potential $P32_i$. The potentials, that is, the signal levels at the first output node $34_{i1}$ and the second output node $34_{i2}$ follow the potentials (signal levels) at the inputs $IN_{1i}$, $IN_{2i}$ of the inverters $34_1$, $34_2$. According to one example, a threshold voltage of each of the first and second inverters $34_1$, $34_2$ is higher than a threshold voltage of each of the first and second input transistors $35_1$, $35_2$. The "threshold voltage" of the inverters $34_1$, $34_2$ denotes that level of the input voltage received at the input $IN_{1i}$, $IN_{2i}$ of the respective inverter $34_1$, $34_2$ at which the inverter $34_1$, $34_2$ changes its operation state. That is, the electrical potential at the output $OUT_{1i}$, $OUT_{2i}$ of the respective inverter $34_1$, $34_2$ changes from the higher second supply potential $P33_i$ to the lower first supply potential $P32_i$ when the input voltage (which is referenced to the first potential $P32_i$) rises above the threshold, and the electrical potential at the output $OUT_{1i}$, $OUT_{2i}$ of the respective inverter $34_1$, $34_2$ changes from the lower first supply potential $P32_i$ to the higher second supply potential $P32_i$ when the input voltage (which is referenced to the first potential $P32_i$) falls below the threshold. According to one example, the threshold is about 50% of the supply voltage $V3_i$ ($V3_i/2$). The "threshold voltage" of the input transistors $35_1$, $35_2$ denotes the magnitude of that level of the voltage received between the control node and one load node of the respective input transistor $35_1$, $35_2$ at which the respective input transistor 351, 352 switches on.

Figure 7:
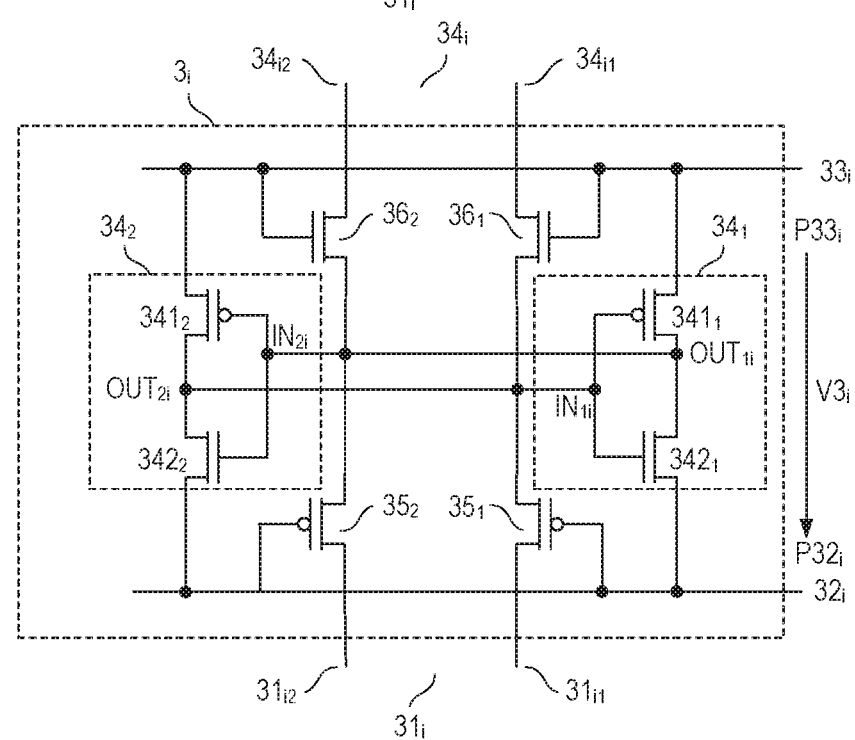
FIG. 7 shows the level shifter cell shown in FIG. 6 in greater detail.

FIG. 7 shows one example of the first and second inverters $34_1$, $34_2$ in greater detail. According to this example, each of these inverters $34_1$, $34_2$ includes two complementary transistors $341_1$, $341_2$, $342_1$, $342_2$. The two transistors of each inverter 341, 342 have their load paths connected in series between the second supply node $33_i$ and the first supply $32_i$ and have their control nodes connected together. A circuit node common to the control nodes of the two transistors of each of the first and second inverters $34_1$, $34_2$ form the input $IN_{1i}$, $IN_{2i}$ of the respective inverter. Further, the output $OUT_{1i}$, $OUT_{2i}$ of each inverter is formed by a circuit node common to the load paths of the two transistors of the respective inverter.

Figure 8:
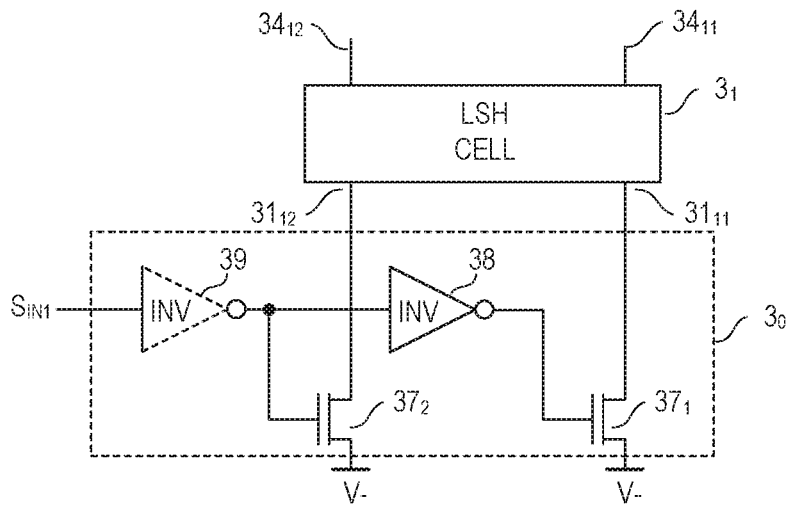
FIG. 8 shows one example of an input cell of the level shifter.

FIG. 8 shows one example of the input cell $3_0$. In this example the input cell $3_0$ includes a first electronic switch $37_1$ that has its load path connected between the first input node $31_{11}$ of the lowermost level shifter cell $3_1$ (from which only the first input node $31_{11}$ and the second input node $31_{12}$ are shown in FIG. 8) and the reference node, and a second electronic switch $37_2$ that has its load path connected between the second input node $31_{12}$ of the lowermost level shifter cell $3_0$ and the reference node. The first and second electronic switches $37_1$, $37_2$ are driven in a complementary fashion based on the first input signal $S_{IN1}$. For this, control nodes of these first and second electronic switches $37_1$, $37_2$ receive complementary drive signals that are each based on the first input signal $S_{IN1}$. In the example shown in FIG. 8, the second electronic switch $37_2$ receives the first input signal $S_{IN1}$ and the first electronic switch $37_1$ receives an inverted version of the first input signal $S_{IN1}$ from an inverter 38 coupled between the first input IN1 and the control node of the first electronic switch $37_1$. Optionally, another inverter 39 is coupled between the first input IN1 and the control node of the second electronic switch $37_2$ and the input of the inverter 38. This inverter generates a well-defined signal level, which is either $V_{SUP}$ or V−, of an input signal received by the second electronic switch Optionally, this inverter 39 may be replaced by a Schmitt trigger.

Referring to FIG. 8, the first and second electronic switches $37_1$, $37_2$ may be implemented as transistors. Just for the purpose of illustration, these transistors $37_1$, $37_2$ are drawn as MOSFETs in FIG. 8; other types of transistors may be used as well.

Figure 9:
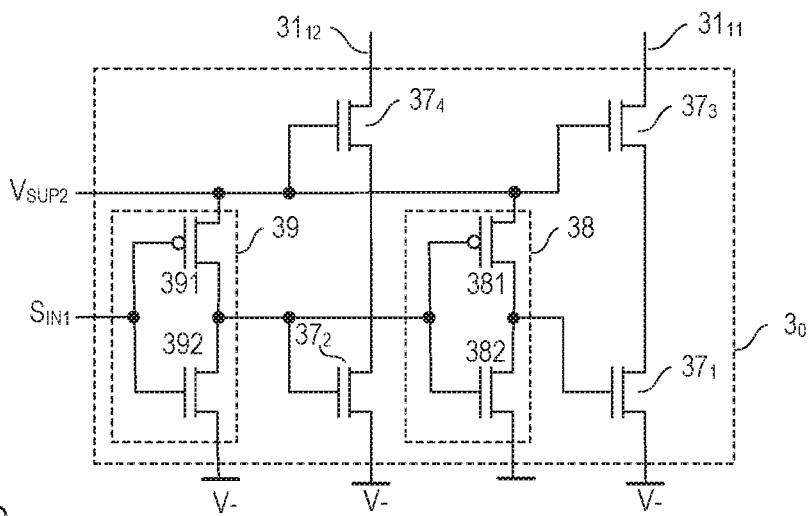
FIG. 9 shows one example of the input cell shown in FIG. 8 in greater detail.

FIG. 9 shows examples of the inverter 38 and the optional further inverter 39 in greater detail. In this example each of these inverters includes a series circuit with two complementary transistors 381, 382 and 391, 392 that have their load paths connected in series between the reference node and a supply node for receiving a supply voltage $V_{SUP2}$. According to one example, this supply voltage $V_{SUP2}$ equals the supply voltage $V_{SUP1}$ explained herein before.

Referring to FIG. 9, optionally, a first cascode transistor $37_3$ is connected between the first electronic switch $37_1$ and the first input node $31_{11}$ of the lowermost level shifter cell $3_1$, and a second cascode transistor $37_4$ is connected between the second electronic switch $37_2$ and the first input node $31_{12}$ of the lowermost level shifter cell $3_1$. Control nodes (gate nodes) of these cascode transistors $37_3$, $37_4$ receive the supply voltage $V_{SUP2}$. These cascode transistors $37_3$, $37_4$ limit voltages across the first and second electronic switches $37_1$, $37_2$ essentially to the supply voltage $V_{SUP2}$ minus a threshold voltage of the respective cascode transistor $37_3$, $37_4$ and, therefore, protect the first and second electronic switches from higher voltages which may occur at the first and second input nodes $31_{11}$, $31_{12}$ of the lowermost level shifter cell $3_1$.

Figure 10:
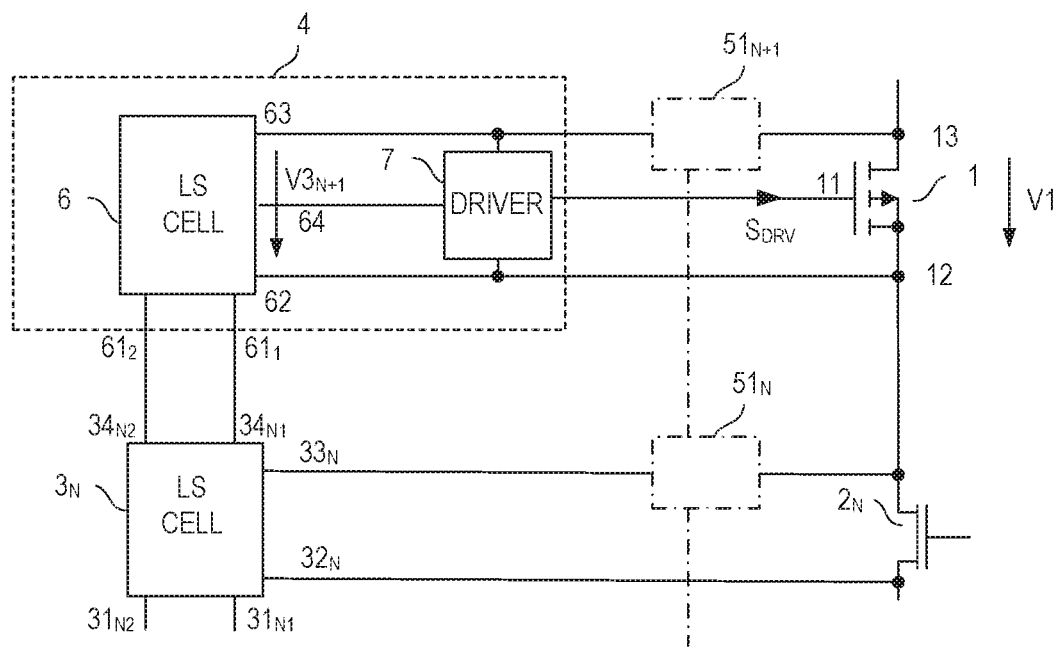
FIG. 10 shows one example of a drive circuit configured to drive the first electronic switch.

FIG. 10 shows one example of the drive circuit 4 that drives the first electronic switch 1. In this example, the drive circuit 4 includes a level shifter cell 6 with a differential input. The differential input includes a first input node $61_1$ connected to the first output node $34_{N1}$ of the uppermost level shifter cell $3_N$ and a second input node $62_2$ connected to a second output node $34_{N2}$ of the uppermost level shifter cell $3_N$. The level shifter cell 6 receives a supply voltage $V3_{N+1}$ between a second supply node 63 and a first supply node 62. According to one example, the first supply node 62 is connected to the first load node 12 of the first electronic switch 1, and the second supply node 63 is connected to the second load node 13 of the first electronic switch 1. Optionally, the voltage select circuit 5 explained herein before includes another select cell $5_{N+1}$ (illustrated in dashed and dotted lines in FIG. 10), wherein this further select cell $5_{N+1}$ is connected between the second load node 13 of the first electronic switch 1 and the second supply node 63. This select cell $51_{N+1}$ is connected to the select cell $51_N$ explained before associated with the uppermost level shifter cells $3_N$ in the same way two other select cells of the voltage select circuit 5 are coupled with each other.

Referring to FIG. 10, the level shifter cell 6 includes an output coupled to a driver 7. According to one example, the driver 7 receives the same supply voltage $V3_{N+1}$ as the level shifter cell 6 and is configured to generate the drive signal $S_{DRV}$ received by the control node 11 of the first electronic switch 1 based on an output signal provided by the level shifter cell 6. According to one example, the level shifter cell 6 in the drive circuit 4 is implemented in the same fashion as the level shifter cells $3_1$-$3_N$ of the level shifter 3.

Figure 11:
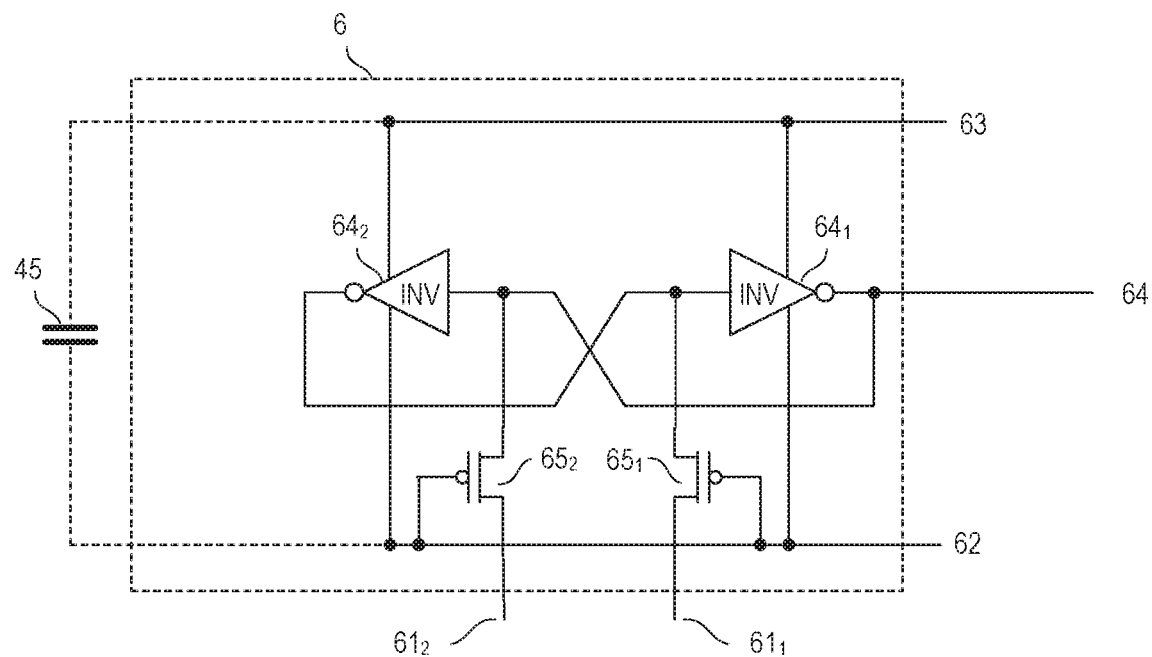
FIG. 11 shows one example of a level shifter cell included in the drive circuit shown in FIG. 10.

One example of the level shifter cell 6 of the drive circuit 4 is illustrated in FIG. 11. Like the level shifter cell $3_i$ explained with reference to FIG. 6, the level shifter cell 6 shown in FIG. 11 includes two cross-coupled inverters $64_1$, $64_2$ and two input transistors $65_1$, $65_2$. The level shifter cell 6 shown in FIG. 11 is different from the level shifter cell $3_i$ shown in FIG. 6 in that the level shifter cell 6 shown in FIG. 11 does not include output transistors. The output 64 of the level shifter cell 6 is formed by the output of the first inverter $64_1$.

Figure 12:
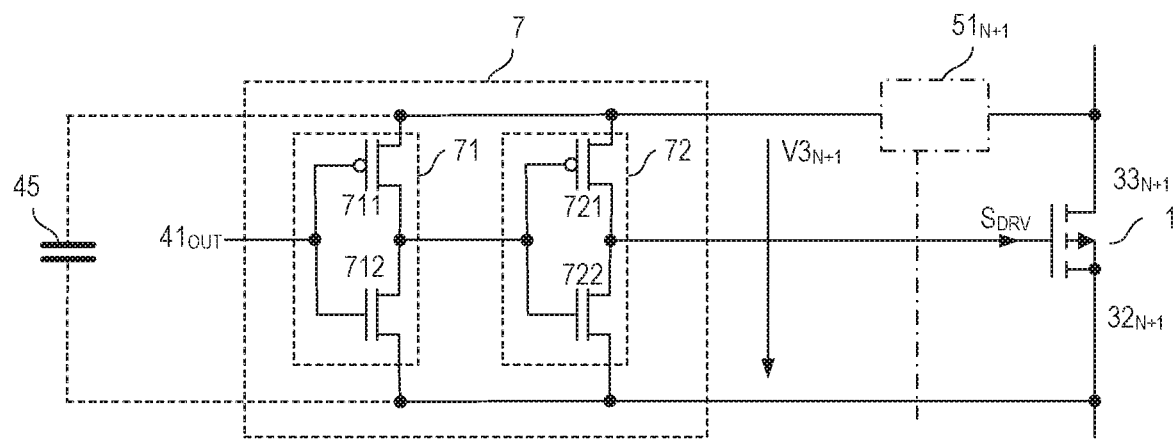
FIG. 12 shows one example of a driver included in the drive circuit shown in FIG. 10.

FIG. 12 shows one example of the drive circuit 7. In this example, the drive circuit 7 includes two inverters 71, 72, with each inverter including a series circuit of two complementary transistors 711, 712, 721, 722. A first one 71 of these inverters receives an output signal from the level shifter cell 6, a second one 72 of these inverters receives an output signal from the first inverter 71 and provides the drive signal $S_{DRV}$. The transistors of these inverters 71, 72 are connected in series between the supply nodes where the supply voltage $V3_{N+1}$ is available.

The electronic circuit of the type explained above that includes the first electronic switch 1 and the switch circuit 2 with a plurality of second electronic switches $2_0$-$2_N$ can be used as half-bridge circuit in any type of circuit application in which a half-bridge with a low-side switch and a high-side switch is required. In the electronic circuit, the first electronic switch 1 acts as a high-side switch and the switch circuit 2 acts as low-side switch. Examples of circuit applications include, but are not restricted to, H-bridge circuits with two half-bridges, power converter circuits such as buck converter circuits or boost converter circuits, resonant converters like LLC-converter, multi-level converters, switched-capacitor converters, or voltage inverters.

Figure 13:
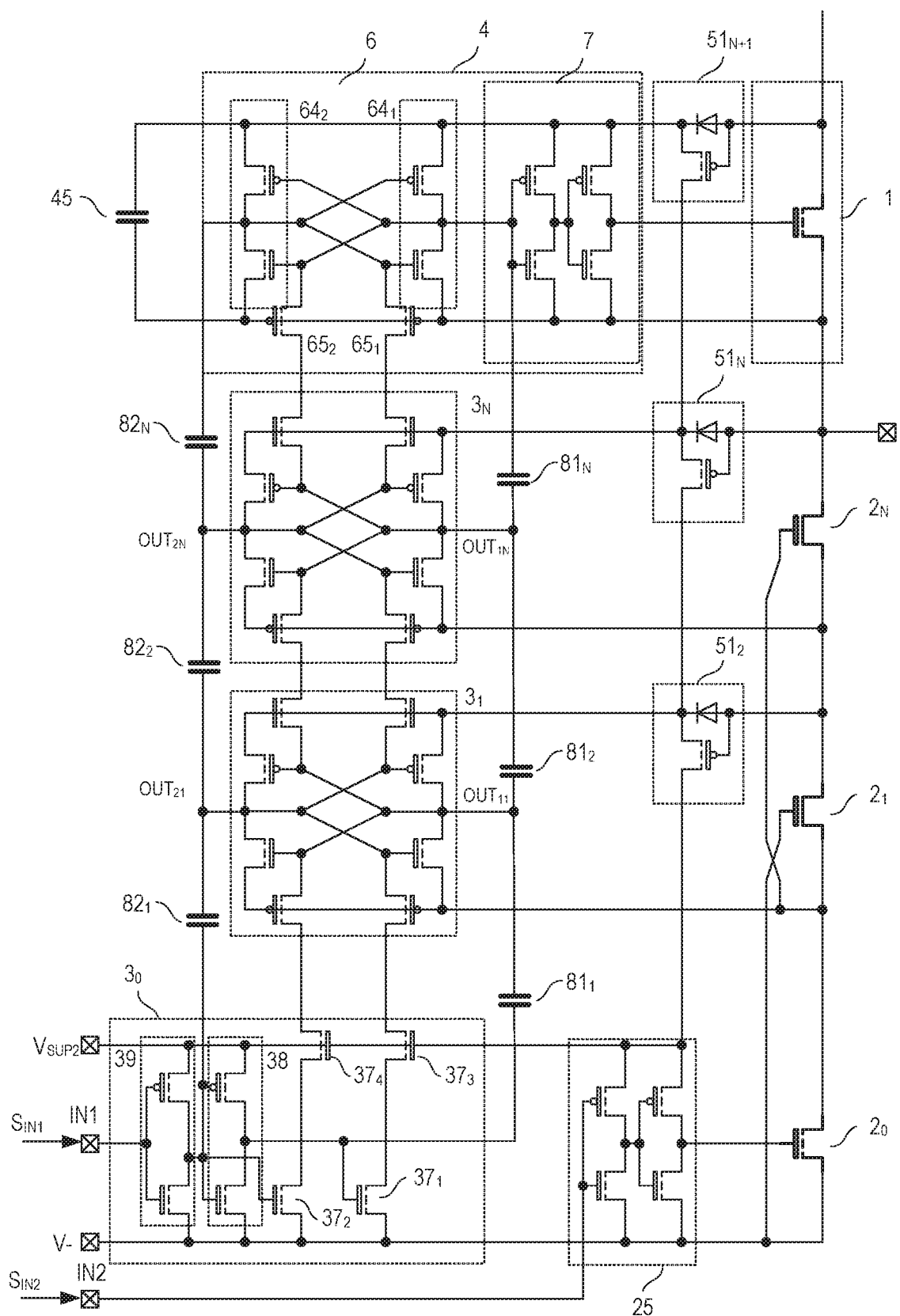
FIG. 13 shows an electronic circuit according to another example.

FIG. 13 shows an example of an electronic circuit that is based on the electronic circuit explained before and additionally includes two capacitor series circuits 81, 82 that help to enhance a switching speed of the electronic circuit. Each of these capacitor series circuits 81, 82 includes a plurality of capacitors $81_1$-$81_N$, $82_1$-$82_N$ connected in series and a plurality of taps, wherein each tap is a circuit node that is common to two neighboring capacitors in the respective series circuit. The capacitor series circuits 81, 82, in particular, increase a switching speed of the level shifter arrangement with the level shifter 3 and the level shifter cell 6 of the drive circuit 6. In the example shown in FIG. 13 the input cell 30 of the level shifter 3 is implemented as shown in FIG. 9, and the level shifter cells $3_1$-$3_N$ are implemented as shown in FIG. 7. Further, the level shifter cell 6 of the drive circuit 4 is implemented as shown in FIG. 11, wherein the first and second inverters $64_1$, $64_2$ are implemented in the same way as the inverters in the level shifter cells $3_1$-$3_N$ and the input cell $3_0$ of the level shifter 3. This specific implementation of the input cell $3_0$ and the level shifter cells $3_1$-$3_N$, however, is only an example. Use of the capacitor series circuits 81, 82 is not restricted to this specific implementation.

Referring to FIG. 13, the first capacitor series circuit 81 is connected between a control node of the first electronic switch $37_1$ in the input cell $3_0$ and the output of the first inverter $64_1$ of the level shifter cell 6 in the drive circuit 4. Further, each tap of the first capacitor circuit 81 is connected to the output $OUT_{11}$, $OUT_{1N}$ of the first inverter in a respective level shifter cell $3_1$-$3_N$. Thus, there is a capacitor $81_1$ between the control node of the first electronic switch $37_1$ in the input cell $3_0$ and the output $OUT_{11}$ of the first inverter in one level shifter cell (the level shifter cell labelled with $3_1$ in the example shown in FIG. 13), there is a capacitor $81_N$ between the output $OUT_{1N}$ of the first inverter in one level shifter cell (the level shifter cell labelled with $3_N$ in the example shown in FIG. 13) and the output of the first inverter $64_1$ of the level shifter cell 6 in the drive circuit 4, and there is a respective capacitor between the outputs of the first inverters of each pair of neighboring level shifter cells (wherein there is only one pair of neighboring level shifter cells $3_1$,$3_N$ shown in FIG. 13).

The second capacitor series circuit 82 is connected between a control node of the second electronic switch $37_2$ in the input cell $3_0$ and the output of the second inverter $64_2$ of the level shifter cell 6 in the drive circuit 4. Further, each tap of the second capacitor circuit 82 is connected to the output $OUT_{21}$, $OUT_{2N}$ of the second inverter in a respective level shifter cell $3_1$-$3_N$. Thus, there is a capacitor $82_1$ between the control node of the second electronic switch $37_2$ in the input cell $3_0$ and the output $OUT_{21}$ of the second inverter in one level shifter cell (the level shifter cell labelled with $3_1$ in the example shown in FIG. 13), there is a capacitor $82_N$ between the output $OUT_{2N}$ of the second inverter in one level shifter cell (the level shifter cell labelled with $3_N$ in the example shown in FIG. 13) and the output of the second inverter $64_2$ of the level shifter cell 6 in the drive circuit 4, and there is a respective capacitor between the outputs of the second inverters of each pair of neighboring level shifter cells (wherein there is only one pair of neighboring level shifter cells $3_1$,$3_N$ shown in FIG. 13).

Assume, that by virtue of a change of the signal level of the input signal $S_{IN1}$ the signal at the control node of the first electronic switch $37_1$ in the input cell $3_0$ and the signal at the control node of the second electronic switch $37_2$ in the input cell $3_0$ change their signal level oppositely, that is, one signal level goes high and the other one goes low, or vice versa. This indicates that it is desired to change the switching state of the electronic switch 1. In this case, the first capacitor series circuit 81 rapidly changes the potentials at the outputs of the first inverters in the level shifter cells $3_1$-$3_N$, 6 of the level shifter 3 and the drive circuit 6 and the second capacitor series circuit 82 rapidly changes the potentials at the outputs of the second inverters in the level shifter cells $3_1$-$3_N$, 6 of the level shifter 3 and the drive circuit 6 so that the inverters rapidly change their operation state. In this example, the first and second electronic switches $37_1$, $37_2$ do not initiate a change of the operation states of the inverters in the individual level shifter cells, but serve to maintain these inverters in the desired operation state defined by the input signal $S_{IN1}$ until the input signal Sun again changes its signal level.

Figure 14:
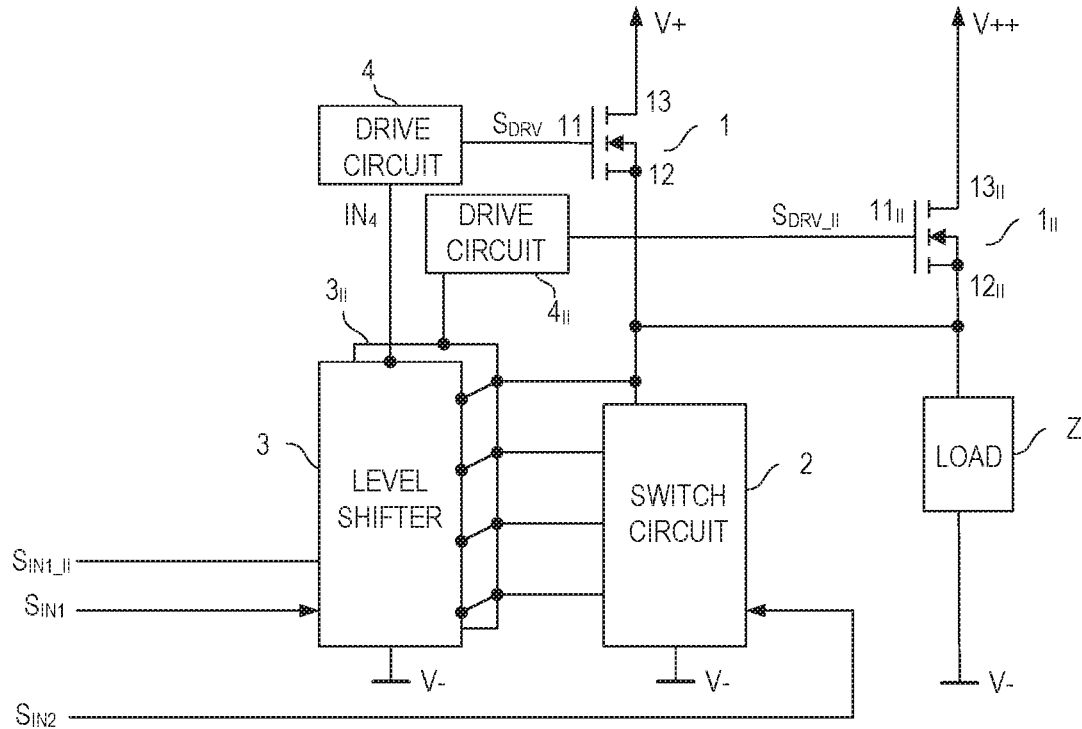
FIG. 14 shows one example of an electronic circuit with two first electronic switches, a switch circuit, and a level shifter.

FIG. 14 shows an electronic circuit according to another example. This electronic circuit is based on the electronic circuit explained before and includes a further electronic switch $1_{II}$ with a control node $11_{II}$ and a load path between a first load node $12_{II}$ and a second load node $13_{II}$. The load path of this further electronic switch $1_{II}$ is connected between a circuit node common to the first electronic switch 1 and the switch circuit 2 and a further supply node for receiving a further supply potential V++. A further drive circuit $4_{II}$ is configured to generate a drive signal $S_{DRV\_II}$ received by the control node $11_{II}$ of the further electronic switch $1_{II}$. The drive circuit $4_{II}$ generates the drive signal $S_{DRV\_II}$ based on a further input signal $S_{IN\_II}$ received by a further level shifter $3_{II}$. This further level shifter $3_{II}$ is coupled to the switch circuit 2 in the same way as the level shifter 3 explained before, and is coupled too the drive circuit $4_{II}$ in the same way the level shifter 3 is coupled to the drive circuit 4. The further drive circuit $4_{II}$ may be implemented in the same way as the drive circuit 4 explained herein before. In the electronic circuit shown in FIG. 14, the switch circuit 2 switches on and off dependent on the second input signal $S_{IN2}$, the first electronic switch 1 switches on and off dependent on the first input signal $S_{IN1}$ received by the level shifter 3, and the further electronic switch $1_{II}$ switches on and off dependent on the further input signal. $S_{IN\_II}$ received by the further level shifter $3_{II}$.

According to one example, the second supply potential V+ received by the first electronic switch 1 and the further supply potential V++ received by the further electronic switch $1_{II}$ are different. In the electronic circuit shown in FIG. 13, a load Z may be connected in series with the first electronic switch 1 and the further electronic switch $1_{II}$ and in parallel with the switch circuit 2. In this type of circuit, the load Z can be connected to the first supply potential V+, which is when the first electronic switch 1 is in on-state, or the further supply potential V++, which is when the further electronic switch $1_{II}$ is in the on-state. When both the first electronic switch 1 and the further electronic $1_2$ are in the off-state the switch circuit 2 may be switched on and act as a freewheeling circuit for the load Z. According to one example, the load Z is an electromagnetic load such as an electromagnetic valve or a relay. In order to activate the load, the load may at first be connected to the further supply potential V++ by switching on the further electronic switch $1_{II}$. After the load has been activated, the electronic circuit may switch over to an "energy saving mode" by switching off the further electronic switch and switching on the electronic switch 1 in order to connect the load Z to the lower supply potential V+, which keeps the load Z in the activated state until the electronic switch 1 switches off.

Figure 15:
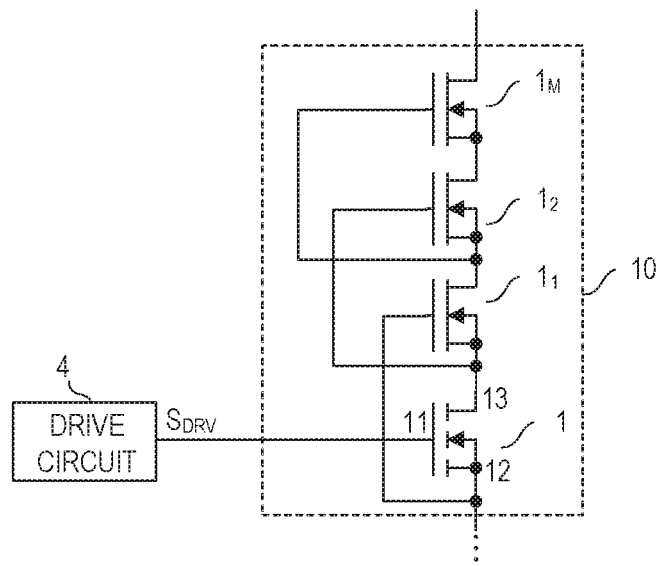
FIG. 15 shows one example of a switch circuit that includes the first electronic switch.

In each of the electronic circuits explained before, the first electronic switch 1 may be part of a switch circuit. One example of a switch circuit 10 that includes the first electronic switch 1 is shown in FIG. 15. The switch circuit 10 shown in FIG. 15 is of the same type as the switch circuit 2 shown in FIG. 5. In this switch circuit 10, a switching state of the first electronic switch 1 defines a switching state of the switch circuit 10. That is, the switch circuit 10 is in the on-state when the first electronic switch 1 is in the on-state, and the switch circuit 10 is in the off-state when the first electronic switch 1 is in the off-state. The switching state of the first electronic switch 1 is defined by the drive signal $S_{DRV}$ received by the first electronic switch 1 from the drive circuit 4. Several further electronic switches $1_1$-$1_M$ are connected in series with the first electronic switch 1 in the switch circuit 10. These further electronic switches $1_1$-$1_M$ are connected such that one $1_1$ of these electronic switches $1_1$-$1_M$ receives as a drive voltage a load path voltage of the first electronic switch 1. The other electronic switches $1_2$-$1_M$ each receive as a drive voltage a load path voltage from a respective one of the other electronic switches $1_2$-$1_M$. According to one example, these electronic switches $1_2$-$1_M$ are normally-on transistors. Just for the purpose of illustration, these electronic switches $1_2$-$1_M$ are drawn as depletion (normally-on) MOSFETs in the example shown in FIG. 14.

Figure 16:
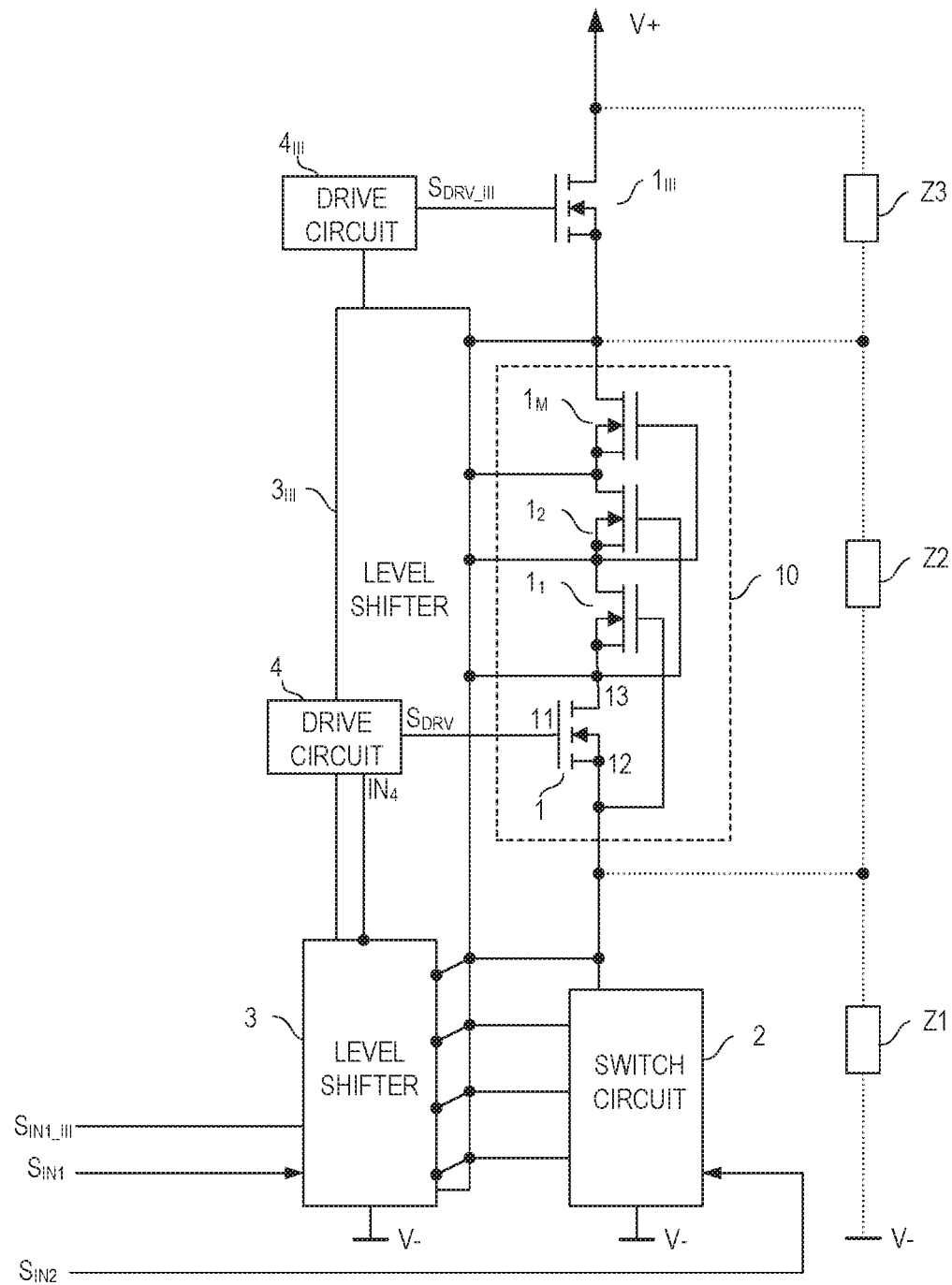
FIG. 16 shows one example of an electronic circuit with a switch circuit, a first level shifter coupled to the switch circuit, a further switch circuit including the first electronic switch, a further level shifter coupled to the switch circuit and the further switch circuit, and a further electronic switch.

FIG. 16 shows an electronic circuit according to another example. This electronic circuit is based on the electronic circuit shown in FIG. 1 and is different from the electronic circuit shown in FIG. 1 in that the first electronic switch 1 is part of a switch circuit 10 of the type shown in FIG. 15 and in that a further electronic switch $1_{III}$ is connected in series with the switch circuit 2 and the further switch circuit 10 including the first electronic switch 1. This further electronic switch $1_{III}$ is driven by a drive signal $S_{DRV_{III}}$ generated by a drive circuit $4_{III}$ based on an input signal $S_{IN\_III}$. This input signal $S_{IN\_III}$ is received by a level shifter $3_{III}$ that is coupled to the further drive circuit $4_{III}$. This level shifter $3_{III}$ may be implemented in the same way as the level shifter 3 explained before. That is, the level shifter $3_{III}$ includes an input cell that receives the input signal $S_{IN\_III}$ and a plurality of level shifter cells. These level shifter cells are cascaded in the same way as explained with reference to level shifter 3 herein before. Some of the level shifter cells of the level shifter $3_{III}$ are coupled to the switch circuit 2 in the same way the level shifter cells of level shifter 3 are coupled to the switch circuit 2. Others of the level shifter cells of the level shifter $3_{III}$ are coupled to the electronic switches 1, $1_1$-$1_M$ of the further switch circuit 10, so that each of these other level shifter cells receives as a supply voltage a load path voltage of one of the electronic switches 1, $1_1$-$1_M$ of the further switch circuit 10. According to one example, a first load Z is connected in parallel with the switch circuit 2 as second load Z2 is connected in parallel with the further switch circuit 10 and another load Z3 is connected in parallel with the further electronic switch $1_{III}$. In this circuit, the switch circuit 2, the first electronic switch 1, and the further electronic switch $1_{III}$ can be switched on and off independently based on the respective input signals $S_{IN1}$, $S_{IN2}$, $S_{IN1\_III}$.

Figure 17:
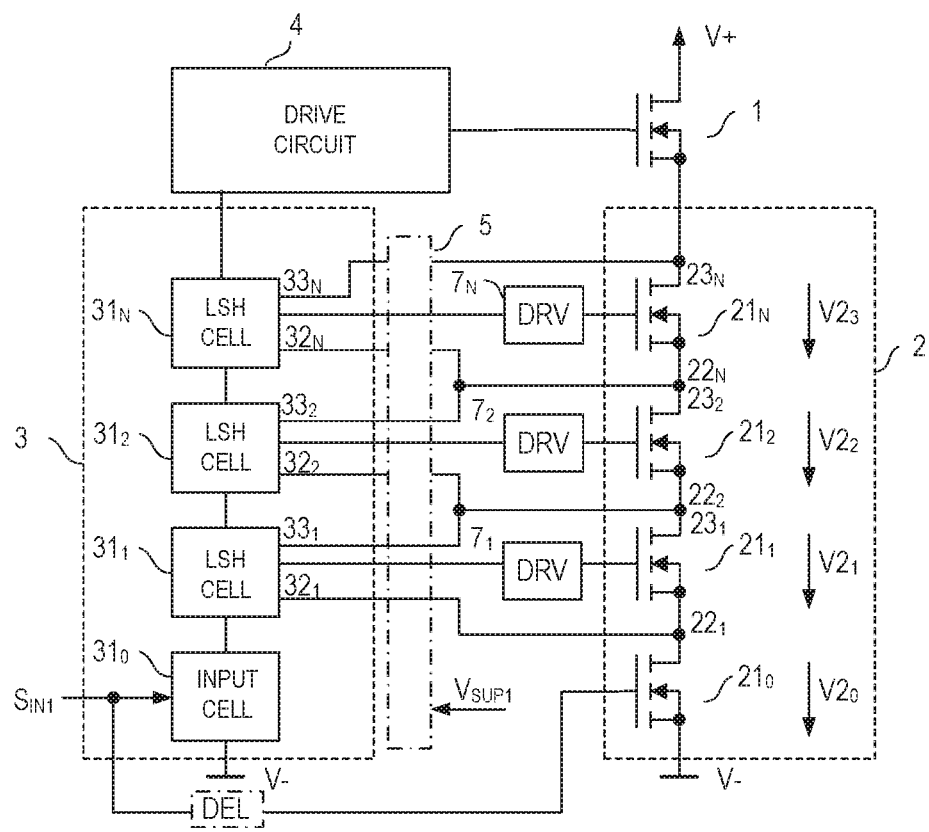
FIG. 17 shows an electronic circuit with a first electronic switch, a switch circuit with several second electronic switches, and a level shifter according to another example.

FIG. 17 shows an electronic circuit according to yet another example. In this electronic circuit, the second electronic switches $2_0$-$2_N$ are enhancement MOSFETs. A lowermost of these second electronic switches $2_0$-$2_N$ receives the second input signal $S_{IN1}$ or, optionally, a delayed version of the first input signal $S_{IN1}$, and each of the other second electronic switches $2_1$-$2_N$ receive a drive signal from the associated level shifter cell $3_1$-$3_N$. According to one example, the drive signal received by each but the lowermost of the second electronic switches $2_1$-$2_N$ is the output signal of the first inverter included in the respective level shifter cell $3_1$-$3_N$. Optionally, there are drivers $7_1$-$7_N$ coupled between the outputs of the individual level shifter cells $3_1$-$3_N$ and the control nodes of the second electronic switches $2_1$-$2_N$. Those drivers may be implemented in the same way as the driver 7 shown in 12. In the electronic circuit shown in FIG. 17, the first electronic switch 1 and the switch circuit 2 with the second electronic switches $2_0$-$2_N$ are switched on and off based on the same input signal, which is the first input signal $S_{IN1}$ in the example shown in FIG. 17. The first electronic switch 1 and the switch circuit 2 therefore act like one electronic switch that has a voltage blocking capability equal to a sum of the voltage blocking capabilities of the first electronic switch 1 and the second electronic switches $2_0$-$2_N$.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
   a first electronic switch;
   a drive circuit comprising an output coupled to a control node of the first electronic switch, and an input;
   a switch circuit with a plurality of second electronic switches, wherein load paths of the second electronic switches are connected in series, and wherein the switch circuit is connected between a first load node of the first electronic switch and a reference node;
   a first signal input configured to receive a first input signal;
   a level shifter coupled between the first signal input and the input of the drive circuit and comprising a plurality of cascaded level shifter cells,
   wherein each of the plurality of level shifter cells comprises a signal input, a signal output, a first supply node and a second supply node, wherein each of the plurality of level shifter cells is associated with a respective one of the plurality of second electronic switches, wherein the first supply node of each of the plurality of level shifter cells is coupled to a first load node of the associated second electronic switch, and the second supply node of each level shifter cell is coupled to a second load node of the associated second electronic switch, wherein the switch circuit comprises an input configured to receive a second input signal, and wherein the switch circuit is configured to switch on or off dependent on the second input signal.

2. The electronic circuit of claim 1, wherein the level shifter comprises an input cell configured to receive the first input signal and connected between the plurality of level shifter cells and the reference node.

3. The electronic circuit of claim 1, further comprising a select circuit configured to receive a supply voltage and coupled between the switch circuit and the level shifter.

4. The electronic circuit of claim 3, wherein the select circuit comprises a plurality of select cells, wherein each of the plurality of select cells is associated with a respective one of the plurality of level shifter cells, and wherein each of the plurality of select cells is connected between the first and second supply nodes of the associated level shifter cell and the first and second load nodes of the second electronic switch associated with the associated level shifter cell.

5. The electronic circuit of claim 1, wherein the signal input of each of the plurality of level shifter cells is a differential input, and wherein the signal output of each of the plurality of level shifter cells is a differential output.

6. The electronic circuit of claim 1, wherein each level shifter cell of the level shifter includes a first inverter and a second inverter that are cross-coupled.

7. The electronic circuit of claim 1, wherein the drive circuit comprises:

a level shifter cell with an input connected to the output of an uppermost level shifter cell of the level shifter, a first supply node coupled to the first load node of the first electronic switch, and a second supply node coupled to a second load node of the first electronic switch.

8. The electronic circuit of claim 7, wherein the level shifter cell of the drive circuit includes a first inverter and a second inverter that are cross-coupled.

9. The electronic circuit of claim 7, further comprising:

a first capacitor series circuit connected between a circuit node of the input cell and the level shifter cell of the drive circuit, and coupled to the level shifter cells of the level shifter; and a second capacitor series circuit connected between a circuit node of the input cell and the level shifter cell of the drive circuit, and coupled to the level shifter cells of the level shifter.

10. The electronic circuit of claim 9, wherein the first capacitor series circuit connected to the level shifter cell of the drive circuit comprises the first capacitor series circuit connected to an output of the first inverter of this level shifter cell, wherein the first capacitor series circuit coupled to the level shifter cells of the level shifter comprises the first capacitor series circuit coupled to outputs of the first inverters of these level shifter cells, wherein the second capacitor series circuit connected to the level shifter cell of the drive circuit comprises the second capacitor series circuit connected to an output of the second inverter of this level shifter cell, and wherein the second capacitor series circuit coupled to the level shifter cells of the level shifter comprises the second capacitor series circuit coupled to outputs of the second inverters of these level shifter cells.

11. The electronic circuit of claim 9, wherein the input cell comprises a first electronic switch and a second electronic switch each coupled to the signal input of a first one of the plurality of level shifter cells of the level shifter, wherein the first capacitor series circuit connected to the input cell comprises the first capacitor series circuit connected to a control node of the first electronic switch, and wherein the second capacitor series circuit connected to the input cell comprises the second capacitor series circuit connected to a control node of the second electronic switch.

12. The electronic circuit of claim 11, wherein the second supply node of the level shifter cell of the drive circuit is coupled to the second load node of the first electronic switch via a select cell of a select circuit.

13. The electronic circuit of claim 1, further comprising:

a further switch circuit that includes the first electronic switch and at least one other electronic switch and is connected in series with the switch circuit;

a further electronic switch connected in series with the switch circuit and the further switch circuit;

a further drive circuit configured to drive the further electronic switch; and a further level shifter connected to the further drive circuit and configured to receive a further drive signal, wherein the further level shifter comprises a plurality of level shifter cells and is further coupled to the switch circuit and the further switch circuit.

14. The electronic circuit of claim 1, further comprising:

a plurality of drive circuits each coupled to a respective one of the plurality of level shifter cells and configured to drive a respective one of the plurality of second electronic switches.

15. The electronic circuit of claim 1, further comprising a second input configured to receive the second input signal.

16. The electronic circuit of claim 1, further comprising circuit elements configured to generate the second input signal based on the first input signal.

17. A method, comprising:

driving a first electronic switch by a first drive circuit based on an input signal received by the first drive circuit; and generating the input signal received by the first drive circuit by a level shifter based on an input signal received by the level shifter, wherein the level shifter comprises a plurality of cascaded level shifter cells, wherein each of the plurality of level shifter cells is associated with a respective one of a plurality of second electronic switches and has a first supply node coupled to a first load node of the associated second electronic switch, and wherein load paths of the plurality of second electronic switches are connected in series between a first load node of the first electronic switch and a reference node, wherein a switch circuit which includes a second drive circuit for the plurality of second electronic switches also comprises an input configured to receive a second input signal, and wherein the switch circuit is configured to switch on or off dependent on the second input signal, wherein the first electronic switch and the switch circuit are switched on and off independent from one another.

18. An electronic circuit, comprising:

a first electronic switch;

a drive circuit comprising an output coupled to a control node of the first electronic switch, and an input;

a switch circuit with a plurality of second electronic switches, wherein load paths of the second electronic switches are connected in series, and wherein the switch circuit is connected between a first load node of the first electronic switch and a reference node;

a first signal input configured to receive a first input signal;

a level shifter coupled between the first signal input and the input of the drive circuit and comprising an input cell and a plurality of cascaded level shifter cells, wherein each of the plurality of level shifter cells comprises a signal input, a signal output, a first supply node and a second supply node, wherein each of the plurality of level shifter cells is associated with a respective one of the plurality of second electronic switches, wherein the first supply node of each of the plurality of level shifter cells is coupled to a first load node of the associated second electronic switch, and the second supply node of each level shifter cell is coupled to a second load node of the associated second electronic switch, wherein the drive circuit comprises a level shifter cell with an input connected to the output of an uppermost level shifter cell of the level shifter, a first supply node coupled to the first load node of the first electronic switch, and a second supply node coupled to a second load node of the first electronic switch, the electronic circuit further comprising:

a first capacitor series circuit connected between a first control node of the input cell of the level shifter cell and a first output node of level shifter cell in the drive circuit, and coupled to the level shifter cells of the level shifter; and a second capacitor series circuit connected between a second node of the input cell of the level shifter cell and a second output node of level shifter cell in the drive circuit, and coupled to the level shifter cells of the level shifter.

* * * * *